(12) United States Patent
Zhang et al.

(10) Patent No.: US 12,253,414 B2
(45) Date of Patent: Mar. 18, 2025

(54) IMAGE SENSOR AND PREPARATION METHOD THEREOF, AND ELECTRONIC DEVICE

(71) Applicant: HUAWEI TECHNOLOGIES CO., LTD., Guangdong (CN)

(72) Inventors: Youming Zhang, Shenzhen (CN); Lifeng Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 342 days.

(21) Appl. No.: 17/855,313

(22) Filed: Jun. 30, 2022

(65) Prior Publication Data

US 2022/0341782 A1 Oct. 27, 2022

Related U.S. Application Data

(63) Continuation of application No. PCT/CN2019/130438, filed on Dec. 31, 2019.

(51) Int. Cl.
*G01J 3/28* (2006.01)
*H01L 27/146* (2006.01)
*H04N 25/772* (2023.01)

(52) U.S. Cl.
CPC ...... *G01J 3/2823* (2013.01); *H01L 27/14621* (2013.01); *H01L 27/14627* (2013.01); *H04N 25/772* (2023.01)

(58) Field of Classification Search
CPC ............ G01J 3/2823; H01L 27/14621; H01L 27/14627; H01L 27/14645; H01L 27/14685; H04N 25/772
(Continued)

(56) References Cited

U.S. PATENT DOCUMENTS

| 2010/0327151 A1 | 12/2010 | Blayvas |
| 2020/0025610 A1* | 1/2020 | Chandrasekar ....... G01J 3/2803 |
| 2020/0266230 A1* | 8/2020 | Miyata ............. H01L 27/14627 |

FOREIGN PATENT DOCUMENTS

| CN | 105589506 A | 5/2016 |
| CN | 108139519 A | 6/2018 |

(Continued)

OTHER PUBLICATIONS

Sell et al., "Periodic Dielectric Metasurfaces with High-Efficiency, Multiwavelength Functionalities," Advanced Optical Materials, Oct. 16, 2017, vol. 5, No. 23, 8 pages.
(Continued)

*Primary Examiner* — Lin Ye
*Assistant Examiner* — Chan T Nguyen
(74) *Attorney, Agent, or Firm* — Fish & Richardson P.C.

(57) ABSTRACT

An image sensor includes an array of metasurface structures and an array of optical-to-electrical conversion units. The array of metasurface structures is located above the array of optical-to-electrical conversion units. A first optical-to-electrical conversion unit in the array of optical-to-electrical conversion units includes a plurality of optical-to-electrical conversion elements, each optical-to-electrical conversion element in the first optical-to-electrical conversion unit corresponds to one frequency band in a spectrum. A first metasurface structure in the array of metasurface structures includes a first substrate and a microstructure located above the first substrate. The first substrate and the microstructure are configured to transmit an optical signal at each frequency band to an optical-to-electrical conversion element corresponding to each frequency band. The microstructure is a rotationally symmetric structure, and a rotation angle of the rotationally symmetric structure is less than or equal to 90 degrees.

20 Claims, 8 Drawing Sheets

(58) Field of Classification Search
USPC .................................................. 348/207.99
See application file for complete search history.

(56) References Cited

FOREIGN PATENT DOCUMENTS

| | | | | | |
|---|---|---|---|---|---|
| CN | 108511469 | * | 9/2018 | ........... | H01L 27/146 |
| CN | 108511469 A | | 9/2018 | | |
| CN | 108712622 A | | 10/2018 | | |
| CN | 109716177 A | | 5/2019 | | |
| EP | 4044233 A1 | | 8/2022 | | |
| KR | 20180064134 A | | 6/2018 | | |
| WO | 2017044637 A1 | | 3/2017 | | |
| WO | WO2017044637 | * | 3/2017 | ............... | G02B 5/18 |
| WO | 2019202890 A1 | | 10/2019 | | |

OTHER PUBLICATIONS

Extended European Search Report in European Appln No. 19958168.7, dated Sep. 9, 2022, 11 pages.
International Search Report and Written Opinion in International Appln. No. PCT/CN2019/130438, mailed on May 22, 2020, 17 pages (with English translation).
Office Action in Korean Appln. No. 10-2022-7024144, mailed on Nov. 8, 2023, 10 pages (with English translation).

\* cited by examiner

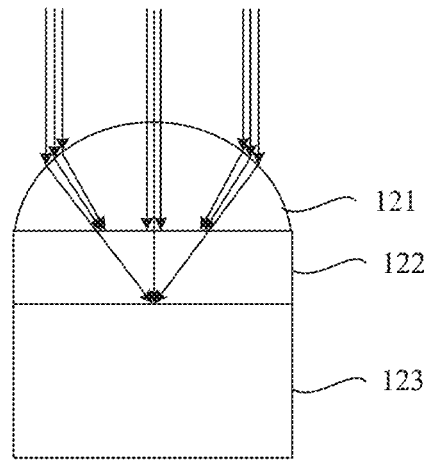
FIG. 4
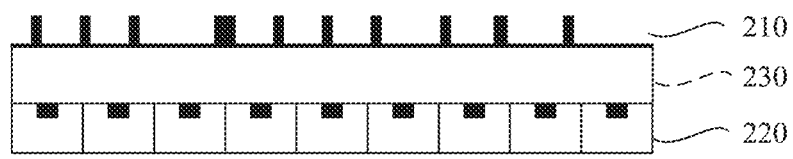
FIG. 5
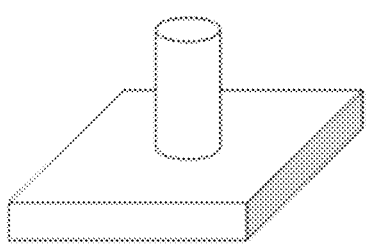 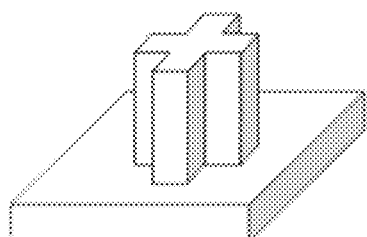 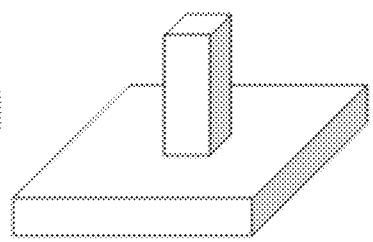
FIG. 6(a)    FIG. 6(b)    FIG. 6(c)

IMAGE SENSOR AND PREPARATION METHOD THEREOF, AND ELECTRONIC DEVICE

CROSS-REFERENCE TO RELATED APPLICATIONS

This application is a continuation of International Application No. PCT/CN2019/130438, filed on Dec. 31, 2019, the disclosure of which is hereby incorporated by reference in its entirety.

TECHNICAL FIELD

Embodiments of this application relate to the field of optical imaging, and in particular, to an image sensor and a preparation method thereof, and an electronic device.

BACKGROUND

An image sensor can convert an optical image into an electrical signal, and is widely applied to a plurality of electronic devices, for example, a digital camera. Hardware of the digital camera mainly includes a lens group, an image sensor, an electrical signal processor, and the like. The lens group is configured to image an optical image on the image sensor. The image sensor is configured to convert an optical signal of an image into an analog electrical signal and input the analog electrical signal to the electrical signal processor. The electrical signal processor converts the analog electrical signal into a digital signal, and outputs a photo after data processing. As an optical-to-electrical converter, the image sensor is one of core parts of the digital camera, and its performance directly determines quality of output photos.

An optical-to-electrical conversion element of the image sensor can convert optical signals of different intensities into electrical signals of different intensities. However, the optical-to-electrical conversion element cannot distinguish a frequency of light, that is, cannot distinguish a color. Therefore, a picture directly obtained through the image sensor without a color collection layer is black-and-white. To obtain a color picture, a color filtering system needs to be used as the color collection layer to obtain color information of the picture. For example, based on a characteristic that human eyes are sensitive to a spectrum of red, green, and blue (RGB) three primary colors, an RGB color filter is arranged on the optical-to-electrical conversion element to form an RGB mosaic Bayer color filter system, so that a color picture can be obtained. However, for each spectral channel, more than 70% of light is filtered out by the Bayer color filter, and only less than 30% of the light can reach the optical-to-electrical conversion element and be converted into an electrical signal for final computational imaging. As a result, light utilization of the image sensor based on the Bayer color filter system is very low.

SUMMARY

This application provides an image sensor and a preparation method thereof, and an electronic device, to improve light utilization of the image sensor.

According to a first aspect, an image sensor is provided, including: an array of metasurface structures and an array of optical-to-electrical conversion units. The array of metasurface structures is located above the array of optical-to-electrical conversion units, the metasurface structure includes a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees.

It should be understood that, in this embodiment of this application, the microstructure and the first substrate are configured to transmit the optical signal at each frequency band to the optical-to-electrical conversion element corresponding to each frequency band. In some cases, it may also be understood that the microstructure and the first substrate are configured to focus the optical signal at each frequency band to the optical-to-electrical conversion element corresponding to each frequency band.

The rotationally symmetric structure is a structure that rotates around a center point of the rotationally symmetric structure by an angle and that can overlap the rotationally symmetric structure. An angle of rotation is the rotation angle. The microstructure in this embodiment of this application rotates 90 degrees around a center point of the microstructure or rotates by an angle less than 90 degrees, and can overlap the microstructure.

There may be one or more microstructures on the metasurface structure.

According to the solution in this embodiment of this application, the metasurface structure can be used to adjust a transmission direction of the optical signal, and transmit an optical signal at each frequency band in optical signals received by the entire metasurface structure to an optical-to-electrical conversion element corresponding to the frequency band. An existing light filtering manner is replaced with a light splitting manner, to avoid an optical signal loss in an optical filtering process. A rotationally symmetric structure with a rotation angle less than or equal to 90 degrees is used, and has a same response to optical signals with different polarizations, and therefore there is no polarization dependence. This improves light transmittance of each spectral channel, overall light utilization of the image sensor, and imaging quality of an output image. For example, the polarization may include linear polarization and circular polarization.

With reference to the first aspect, in some implementations of the first aspect, the microstructure and the first substrate are configured to generate a spatial transmission phase in a tangential direction of the array of metasurface structures, to obtain a spatial transmission phase gradient. The spatial transmission phase gradient is used to transmit the optical signal at each frequency band to the optical-to-electrical conversion element corresponding to each frequency band.

According to the solution in this embodiment of this application, transmission directions of optical signals at different frequency bands are controlled by using the spatial transmission phase gradient generated on the array of metasurface structures, so that the optical signals at the different frequency bands can be transmitted to optical-to-electrical conversion elements corresponding to the different frequency bands. This improves light transmittance of each spectral channel, and improves overall light utilization of the image sensor.

With reference to the first aspect, in some implementations of the first aspect, the spatial transmission phase is related to a wavelength of the optical signal at each frequency band, a position at which the optical signal at each frequency band is incident to the metasurface structure, and a position at which the optical signal at each frequency band is transmitted to the optical-to-electrical conversion element corresponding to each frequency band.

Optionally, the metasurface structure may not be in direct contact with the optical-to-electrical conversion unit. The spatial transmission phase distribution is further related to a refractive index of a medium between the metasurface structure and the optical-to-electrical conversion element. In some cases, in other words, the spatial transmission phase distribution is related to the refractive index of the medium between the metasurface structure and the optical-to-electrical conversion unit.

For example, a spatial transmission phase of an $n^{th}$ frequency band at a position on the metasurface structure is related to a wavelength of an optical signal at the $n^{th}$ frequency band, coordinates of a position at which the optical signal at the $n^{th}$ frequency band is transmitted to an optical-to-electrical conversion element corresponding to the $n^{th}$ frequency band, and a refractive index of a medium between the metasurface structure and the optical-to-electrical conversion unit.

With reference to the first aspect, in some implementations of the first aspect, the spatial transmission phase distribution $\phi(x,y,\lambda_n)$ meets:

$$\phi(x, y, \lambda_n) = \frac{2\pi n_{sub}}{\lambda_n} \left[ f_n - \sqrt{(x - x_{f,n})^2 + (y - y_{f,n})^2 + f_n^2} \right] + C$$

x,y represents coordinates of a position on the metasurface structure, $\lambda_n$ represents a wavelength of an optical signal at an $n^{th}$ frequency band, $f_n$ represents a focal length corresponding to the optical signal at the $n^{th}$ frequency band, $x_{f,n}$ and $y_{f,n}$ represent coordinates of a position at which the optical signal at the $n^{th}$ frequency band is transmitted to an optical-to-electrical conversion element corresponding to the $n^{th}$ frequency band, $n_{sub}$ represents a refractive index of a medium between the metasurface structure and the optical-to-electrical conversion unit, and C is any phase.

With reference to the first aspect, in some implementations of the first aspect, the medium is air.

In other words, a hollow structure may be formed between the metasurface structure and the optical-to-electrical conversion unit, and there may be air in the hollow structure.

With reference to the first aspect, in some implementations of the first aspect, the medium includes a second substrate.

The metasurface structure may be in contact with the optical-to-electrical conversion unit by using the second substrate, and the second substrate may be configured to support the metasurface structure.

Optionally, a material of the second substrate may be a low-loss transparent dielectric material. For example, the material of the second substrate may be silicon dioxide glass or the like.

With reference to the first aspect, in some implementations of the first aspect, the microstructure includes a cylindrical structure, a square column structure, or a cross-shaped structure.

With reference to the first aspect, in some implementations of the first aspect, a material of the microstructure includes titanium dioxide, gallium nitride, or silicon carbide.

With reference to the first aspect, in some implementations of the first aspect, a material of the first substrate includes silicon dioxide, titanium dioxide, gallium nitride, or silicon carbide.

With reference to the first aspect, in some implementations of the first aspect, the plurality of optical-to-electrical conversion elements correspond to V different frequency bands in a spectrum, and V is an integer greater than 3.

For example, V may be 4. The four frequency bands may be red, yellow, cyan, and purple. The four frequency bands may also be turquoise, magenta, yellow, and white.

For another example, V may be 7. The seven frequency bands may be red, orange, yellow, green, cyan, blue, and purple.

According to the solution in this embodiment of this application, a quantity of different frequency bands corresponding to one optical-to-electrical conversion unit is increased, so that more frequency spectrum information can be obtained with a small light utilization loss. This improves frequency spectrum utilization of the image sensor, reduces a color information loss of an image, improves color fidelity of imaging, and improves imaging quality.

According to a second aspect, an image sensor preparation method is provided, including: preparing an array of optical-to-electrical conversion units; and preparing an array of metasurface structures on the array of optical-to-electrical conversion units. The optical-to-electrical conversion unit includes a plurality of optical-to-electrical conversion elements, each optical-to-electrical conversion element in the optical-to-electrical conversion unit corresponds to one frequency band in a spectrum, the metasurface structure includes a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees.

For example, the array of optical-to-electrical conversion units and the array of metasurface structures are processed in an integrated manner by using a complementary metal oxide semiconductor (CMOS) process.

According to the solution in this embodiment of this application, the array of optical-to-electrical conversion units and the array of metasurface structures are processed in an integrated manner, so that a good alignment effect between the optical-to-electrical conversion unit and the metasurface structure can be ensured. This improves precision of an image sensor. The metasurface structure can be used to transmit an optical signal at each frequency band in optical signals received by the entire metasurface structure to an optical-to-electrical conversion element corresponding to the frequency band. An existing light filtering manner is replaced with a light splitting manner, to avoid an optical signal loss in an optical filtering process. A rotationally symmetric structure with a rotation angle less than or equal to 90 degrees is used, and has a same response to a polarization of the optical signal, therefore there is no polarization dependence. This improves light transmittance of each spectral channel, overall light utilization of the image sensor, and imaging quality of an output image. For example, the polarization of the optical signal may include linearly polarized light and circularly polarized light.

With reference to the second aspect, in some implementations of the second aspect, the microstructure and the first substrate are configured to generate a spatial transmission phase in a tangential direction of the array of metasurface structures, to obtain a spatial transmission phase gradient. The spatial transmission phase gradient is used to transmit the optical signal at each frequency band to the optical-to-electrical conversion element corresponding to each frequency band.

According to the solution in this embodiment of this application, transmission directions optical signals of different frequency bands are changed by using the spatial transmission phase gradient generated on the array of metasurface structures, so that the optical signals of the different frequency bands can be transmitted to optical-to-electrical conversion elements corresponding to the different frequency bands. This improves light transmittance of each spectral channel, and improves overall light utilization of the image sensor.

According to a third aspect, an image sensor preparation method is provided, including: preparing an array of optical-to-electrical conversion units preparing an array of metasurface structures; and assembling the array of metasurface structures and the array of optical-to-electrical conversion units to obtain an image sensor. The optical-to-electrical conversion unit includes a plurality of optical-to-electrical conversion elements, each optical-to-electrical conversion element in the optical-to-electrical conversion unit corresponds to one frequency band in a spectrum, the metasurface structure includes a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees.

For example, the array of metasurface structures is prepared by using a CMOS process, and then is assembled with the array of optical-to-electrical conversion units.

According to the solution in this embodiment of this application, the array of optical-to-electrical conversion units and the array of metasurface structures are separately processed, and a processing technology is simple. The metasurface structure can be used to transmit an optical signal at each frequency band in optical signals received by the entire metasurface structure to an optical-to-electrical conversion element corresponding to the frequency band. An existing light filtering manner is replaced with a light splitting manner, to avoid an optical signal loss in an optical filtering process. A rotationally symmetric structure with a rotation angle less than or equal to 90 degrees is used, and has a same response to a polarization of the optical signal, therefore there is no polarization dependence. This improves light transmittance of each spectral channel, overall light utilization of the image sensor, and imaging quality of an output image. For example, the polarization of the optical signal may include linearly polarized light and circularly polarized light.

With reference to the third aspect, in some implementations of the third aspect, the microstructure and the first substrate are configured to generate a spatial transmission phase in a tangential direction of the array of metasurface structures, to obtain a spatial transmission phase gradient. The spatial transmission phase gradient is used to transmit the optical signal at each frequency band to the optical-to-electrical conversion element corresponding to each frequency band.

According to the solution in this embodiment of this application, transmission directions of optical signals of different frequency bands are changed by using the spatial transmission phase gradient generated on the array of metasurface structures, so that the optical signals of the different frequency bands can be transmitted to optical-to-electrical conversion elements corresponding to the different frequency bands. This improves light transmittance of each spectral channel, and improves overall light utilization of the image sensor.

According to a fourth aspect, an electronic device is provided, including the image sensor according to any one of the first aspect or the implementations of the first aspect.

According to the solution in this embodiment of this application, the electronic device includes an image sensor based on a metasurface structure. The metasurface structure can transmit an optical signal at each frequency band in optical signals received by the entire metasurface structure to an optical-to-electrical conversion element corresponding to the frequency band. An existing light filtering manner is replaced with a light splitting manner, to avoid an optical signal loss in an optical filtering process. A rotationally symmetric structure with a rotation angle less than or equal to 90 degrees is used, and has a same response to a polarization of the optical signal, therefore there is no polarization dependence. This improves light transmittance of each spectral channel, overall light utilization of the image sensor, and imaging quality of an output image. For example, the polarization of the optical signal may include linearly polarized light and circularly polarized light.

BRIEF DESCRIPTION OF DRAWINGS

FIG. 4 is a schematic diagram of optical signal transmission in one spectral channel;

FIG. 5 is a schematic diagram of a structure of an image sensor according to an embodiment of this application;

FIG. 6(a) to FIG. 6(c) are a schematic diagram of a structure of a microstructure according to an embodiment of this application;

FIGS. 8(a) and 8(h) are a schematic diagram of one color pixel unit in an image sensor according to an embodiment of this application;

DESCRIPTION OF EMBODIMENTS

The following describes the technical solutions of this application with reference to the accompanying drawings.

An electronic device in the embodiments of this application may include a handheld device, an in-vehicle device, a wearable device, a computing device, or another processing device connected to a wireless modem. The electronic device may further include a digital camera, a cellular phone, a smartphone, a personal digital assistant (PDA) computer, a tablet computer, a laptop computer, a machine type communications (MTC) terminal, a point of sales (POS) terminal, an in-vehicle computer, and another electronic device having an imaging function.

For ease of understanding, the following first explains and describes technical terms in this application.

Metamaterial: in a broad sense, a metamaterial refers to a complex of a unit structure that is designed manually and has a physical properly that a conventional natural material does not have. A physical property of the metamaterial is mainly determined by a structure and arrangement of a unit structure of a subwavelength (far less than a wavelength).

Metasurface: The metasurface is a two-dimensional form of the metamaterial, that is, a surface structure formed by a subwavelength micro unit structure.

Focus: When light is emitted into the metasurface structure, the light converges at several points behind the metasurface structure. The several points where the light converges are focuses.

Focal length: relating to a distance, is a measurement indicator used to measure convergence or divergence of light in an optical system. In embodiments of this application, the focal length indicates a distance from an optical center of the metasurface structure to the focus when an infinitely distant scene forms a clear image on a focal plane by using the metasurface structure, and may also be understood as a vertical distance from the optical center of the metasurface structure to the focal plane.

Figure 1:
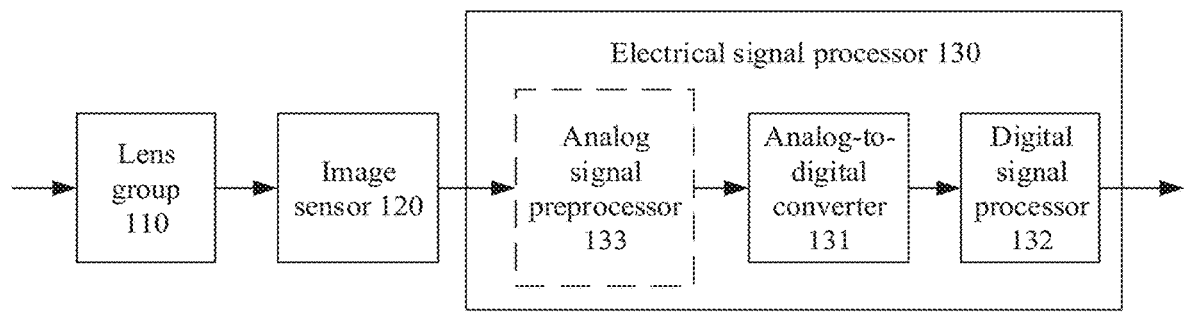
FIG. 1 is a schematic diagram of a structure of an electronic device.

FIG. 1 shows a schematic diagram of an electronic device. As shown in the figure, the electronic device may include a lens group 110, an image sensor 120, and an electrical signal processor 130. The electrical signal processor 130 may include an analog-to-digital (A/D) converter 131 and a digital signal processor 132. The analog-to-digital converter 131 is an analog-to-digital-signal converter, and is configured to convert an analog electrical signal into a digital electrical signal.

It should be understood that the electronic device shown in FIG. 1 is not limited to the foregoing components, and may further include other components such as a battery, a flash, a button, and a sensor. In this embodiment of this application, only an electronic device on which the image sensor 120 is installed is used as an example for description, but components installed on the electronic device are not limited thereto.

An optical signal reflected by a photographed object is converged by using the lens group 110, and is imaged on the image sensor 120. The image sensor 120 converts the optical signal into an analog electrical signal. The analog electrical signal is converted into a digital electrical signal by using the analog-to-digital (A/D) converter 131 in the electrical signal processor 130, and the digital electrical signal is processed by using the digital signal processor 132. For example, the digital signal is optimized by using a series of complex mathematical algorithm operations, and an image is finally output. The electrical signal processor 130 may further include an analog signal preprocessor 133, configured to preprocess an analog electrical signal transmitted by the image sensor and output the preprocessed analog electrical signal to the analog-to-digital converter 131.

Performance of the image sensor 120 affects quality, of the final output image. The image sensor 120 may also be referred to as a photosensitive chip, a photosensitive element, or the like, and includes hundreds of thousands to millions of optical-to-electrical conversion elements. When the image sensor 120 is exposed to light, an electric charge is generated, and is converted into a digital signal by using an analog-to-digital converter chip.

Figure 2:
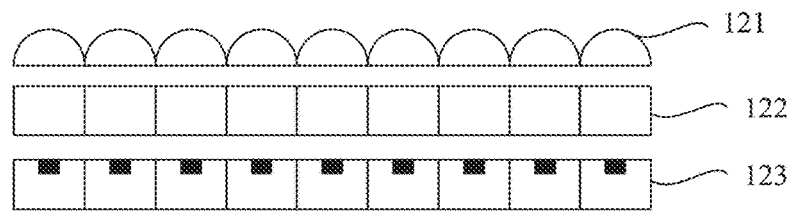
FIG. 2 is a schematic diagram of a structure of an image sensor based on a Bayer filter system.

Generally, the image sensor 120 may obtain color information of an image by using a color filtering system. The color filtering system may be a Bayer color filter system. In other words, the Bayer color fitter is covered above the optical-to-electrical conversion element in the image sensor 120 to form a color filtering system. The optical-to-electrical conversion element may be a photodiode. The Bayer filter may also be referred to as a Bayer filter. FIG. 2 shows a schematic diagram of an image sensor based on a Bayer color filter system. The image sensor includes a microlens 121, a Bayer color filter 122, and a photodiode 123. The Bayer color filter 122 includes an RGB color filter, and the RGB color filter is arranged on a grid of the photodiode to form an RGB mosaic color filter system. Following a biological characteristic that a quantity of green photosensitive cells on a retina of human eyes is largest, the Bayer filter is usually arranged in an RGGB form.

Figure 3:
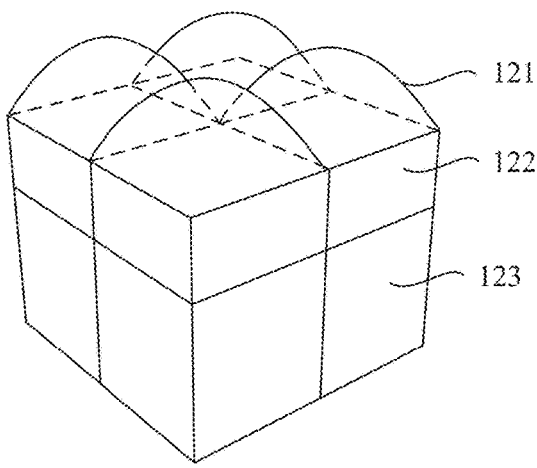
FIG. 3 is a schematic diagram of a structure of a single color pixel unit of an image sensor based on a Bayer filter system.

FIG. 3 shows a schematic diagram of a structure of one color pixel unit in an image sensor based on a Bayer color filter system. As shown in FIG. 3, one color pixel unit includes four color filters 122 and four corresponding photodiode 123 pixel elements. The four color filters 122 are arranged in the RGGB form, to be specific, a red color filter and a blue color filter are located at a diagonal position, and two green light filters are located at a diagonal position. Because a light sensing area of the photodiode 123 is located in a center of an area occupied by the photodiode pixel element, one color pixel unit further includes a microlens 121 array above the color filter 122. The microlens 121 array is configured to converge an optical signal to the light sensing area of the photodiode 123 to ensure light utilization. The microlens 121 array separately converges an incident optical signal to the four color filters 122. After being filtered by the four color filters 122, the incident optical signal is separately transmitted to photodiodes 123 covered by the four color filters 122. In this way, light intensity information and approximate color information of an image are obtained at the same time, and a color image closest to reality, can be restored through optimization by using a software difference algorithm.

However, light utilization of the image sensor based on the Bayer filter system is very low. For each color pixel channel, which can also be referred to as a spectral channel, more than 70% of the optical signal is filtered out by the Bayer color filter, and only less than 30% of light can reach the photodiode and be converted into an electrical signal for final computational imaging. FIG. 4 shows a schematic diagram of a luminous flux of one spectral channel in a color pixel unit. As shown in FIG. 4, for one color pixel unit arranged in an RGGB form, when incident light is white light, to be specific, includes optical signals at all wavelengths of 400 nm (nanometers) to 700 nanometers, if a color filter has an ideal color filtering effect, a theoretical maximum value of a luminous flux after color filtering is only ⅓ of an incident luminous flux. When the incident light is red light or blue light, the theoretical maximum value of the luminous flux after color filtering is ¼ of the incident luminous flux. When the incident light is green light, because there are two green channels, the theoretical maximum luminous flux after color filtering is ½ of the incident luminous flux. In addition, in practice, a color filtering effect of the color filter is not perfect, that is, color filtering and light transmission efficiency of the color filter cannot reach 100%. Therefore, actual light utilization is lower. When the incident light is white light, total light utilization is only about 25%. When the incident light is red light, the light utilization is about 23%. When the incident light is blue light, the light utilization is only about 20%. When the incident light is green light, the light utilization is about 32%.

In addition, the image obtained by the image sensor based on the Bayer color filter system has color distortion. The Bayer filter has only three spectral channels, RGB, while an actual image spectrum is continuously distributed in a visible light band of 400 nm to 700 nanometers. Therefore, spectral information obtained by using the Bayer color filter is actually obtained by performing discrete digitization on a continuous spectrum by using RGB three colors, that is, all light in a band of 400 nm to 500 nanometers is considered as blue, all light in a band of 500 nm to 600 nanometers is considered as green, and all light in a band of 600 nm to 700 nanometers is considered as red. It should be understood that values of the foregoing frequency spectrum bands are merely used as reference data, and a specific frequency range of each frequency spectrum channel is subject to an overall frequency spectrum design of an actual image sensor and an actual frequency spectrum response range of a photodiode. In the foregoing solution, actual spectral information of the image is greatly lost, resulting in color distortion of the final image. In addition, in practice, the color filter overlaps on a transmissive spectrum. In this way, if an incident spectrum is in an overlapping position, the color filter allows light to enter two spectral channels at the same time, which further causes a color reproduction error.

An essence of the Bayer filter is to sacrifice the light utilization in exchange for the spectral information, or color information. More spectral information can be obtained by increasing a quantity of different spectral channels in one color pixel unit. For physical hardware, currently spectral information loss caused when the continuous spectrum is converted into discrete spectral information can be reduced only by increasing a quantity of spectral channels of the Bayer color filter, but this further reduces the light utilization.

FIG. 5 shows a schematic diagram of a structure of an image sensor 200 according to an embodiment of this application. The image sensor 200 may be the image sensor 120 in FIG. 1.

The image sensor 200 includes an array of metasurface structures 210 and an array of optical-to-electrical conversion units 220. The array of metasurface structures 210 is located above the array of optical-to-electrical conversion units 220. The optical-to-electrical conversion unit 220 includes a plurality of optical-to-electrical conversion elements. Each optical-to-electrical conversion element in the optical-to-electrical conversion unit 220 corresponds to one frequency band in a spectrum. The metasurface structure 210 includes a first substrate and a microstructure located above the first substrate, the microstructure and the first substrate are configured to transmit an optical signal at each frequency band to an optical-to-electrical conversion element corresponding to each frequency band. The microstructure is a rotationally symmetric structure, and a rotation angle of the rotationally symmetric structure is less than or equal to 90 degrees.

One metasurface structure 210 may include a plurality of microstructures.

The rotationally symmetric structure is a structure that rotates around a center point of the rotationally symmetric structure by an angle and that can overlap the rotationally symmetric structure. An angle of rotation is the rotation angle. The microstructure in this embodiment of this application rotates 90 degrees around a center point of the microstructure or rotates by an angle less than 90 degrees, and can overlap the microstructure.

In this embodiment of this application, that each optical-to-electrical conversion element corresponds to one frequency band in the spectrum may also be that each optical-to-electrical conversion element corresponds to one frequency spectrum channel.

Optionally, FIG. 6(a) to FIG. 6(c) show a schematic diagram of a microstructure according to an embodiment of this application. The microstructure may be a cylindrical structure, as shown in FIG. 6(a). Alternatively, the microstructure may be a cross-shaped structure, as shown in FIG. 6(b). Alternatively, the microstructure may be a square column structure, as shown in FIG. 6(c), It should be understood that the three structures are merely examples, and shapes of the microstructures are not limited to the three structures.

Optionally, the metasurface structure 210 may not be in direct contact with the optical-to-electrical conversion unit 220, in other words, there may be a medium between the metasurface structure 210 and the optical-to-electrical conversion unit 220.

Specifically, the medium may be air.

For example, a hollow structure may be formed between the metasurface structure 210 and the optical-to-electrical conversion unit 220, and there may be air in the hollow structure.

Specifically, the medium may be a second substrate 230.

For example, the metasurface structure 210 may be in contact with the optical-to-electrical conversion unit 220 by using the second substrate 230, and the second substrate may be configured to support the metasurface structure 210.

Optionally, a material of the second substrate may be a low-loss transparent dielectric material. For example, the material of the second substrate may be silicon dioxide glass or the like.

It should be understood that, in this embodiment of this application, the microstructure and the first substrate are configured to transmit the optical signal at each frequency band to the optical-to-electrical conversion element corresponding to each frequency band. In some cases, it may also be understood that the microstructure and the first substrate are configured to focus the optical signal at each frequency band to the optical-to-electrical conversion element corresponding to each frequency band.

One metasurface structure 210 may correspond to one optical-to-electrical conversion unit 220, the metasurface structure 210 may cover the optical-to-electrical conversion unit 220, and a microstructure and a first substrate on each metasurface structure 210 may transmit an incident optical signal to the optical-to-electrical conversion unit 220 corresponding to the metasurface structure 210. For ease of description, that the microstructure and the first substrate on the metasurface structure 210 transmit the incident optical signal to the optical-to-electrical conversion unit 220 corresponding to the metasurface structure 210 may alternatively be that the metasurface structure 210 transmits the incident optical signal to the optical-to-electrical conversion unit 220 corresponding to the metasurface structure 210.

One color pixel unit may include one metasurface structure 210 and one optical-to-electrical conversion unit 220. The color pixel unit may further include a second substrate 230. The image sensor 200 may include a plurality of color pixel units.

Figure 7A:
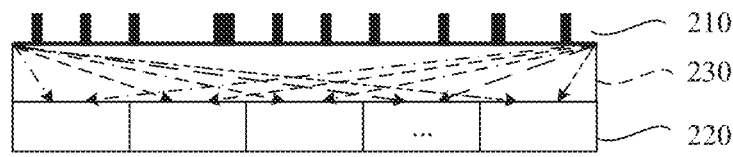
FIG. 7(a) to FIG. 7(c) are a schematic diagram of optical path transmission on an image sensor according to an embodiment of this application.
Figure 7B:
Figure 7C:
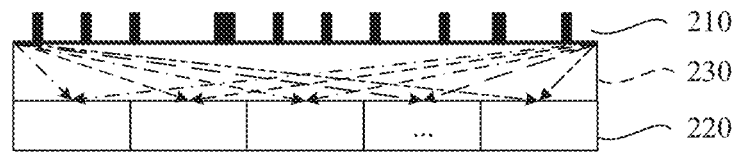

FIG. 7(a) to FIG. 7(c) show a schematic diagram of optical path transmission in one color pixel unit in an image sensor. As shown in FIG. 7(a) to FIG. 7(c), the metasurface structure 210 in FIG. 7(a) to FIG. 7(c) corresponds to the optical-to-electrical conversion unit 220 (an example of the optical-to-electrical conversion unit 220) in FIG. 7(a) to FIG. 7(c). The optical-to-electrical conversion unit 220 includes n optical-to-electrical conversion elements, the n optical-to-electrical conversion elements respectively correspond to n frequency bands in a spectrum, and the n frequency bands may include a same frequency band. The metasurface structure 210 may separately transmit, based on the n frequency bands, all received optical signals to the optical-to-electrical conversion elements corresponding to the n frequency bands in the optical-to-electrical conversion unit 220.

For an optical signal at each frequency band, the optical signal at each frequency band can be transmitted to a light sensing area on an optical-to-electrical conversion element corresponding to each frequency band. For example, a focus may be located below the optical-to-electrical conversion element corresponding to each frequency band, as shown in FIG. 7(a); the focus may also be located above the optical-to-electrical conversion element corresponding to the frequency band, as shown in FIG. 7(b); and the focus may also be located on the optical-to-electrical conversion element corresponding to the frequency band, as shown in FIG. 7(c). A location of the focus is not limited in this embodiment of this application.

The optical-to-electrical conversion element is configured to convert an optical signal into an electrical signal. For example, the optical-to-electrical conversion element may be a photodiode in a complementary metal oxide semiconductor (CMOS). For another example, the optical-to-electrical conversion element may alternatively be a charge-coupled device (CCD).

It should be understood that the optical-to-electrical conversion elements in FIG. 5 and FIG. 7(a) to FIG. 7(c) are arranged in a one-dimensional manner is merely an example, and should not be considered as a limitation on this embodiment of this application. The optical-to-electrical conversion elements may also be arranged in a two-dimensional manner.

For example, one optical-to-electrical conversion unit 220 may include four optical-to-electrical conversion elements. The four optical-to-electrical conversion elements may separately correspond to one of three frequency bands: red light, green light, and blue light. A wavelength of red light may be 600 nm to 700 nanometers, a wavelength of green light may be 500 nm to 600 nanometers, and a wavelength of blue light may be 400 nm to 500 nanometers. Frequency bands corresponding to the four optical-to-electrical conversion elements may be arranged in an RGGB manner, to be specific, two optical-to-electrical conversion elements located on one diagonal correspond to a frequency band of green light, and two optical-to-electrical conversion elements located on the other diagonal respectively correspond to a frequency band of red light and a frequency band of blue light. For ease of description, the frequency band corresponding to the optical-to-electrical conversion element in this embodiment of this application may also be referred to as an arrangement manner of the optical-to-electrical conversion element. For example, that the optical-to-electrical conversion elements are arranged in the RGGB manner means that the frequency band corresponding to the optical-to-electrical conversion element may be arranged in the RGGB manner.

Figures 8A, 8B:
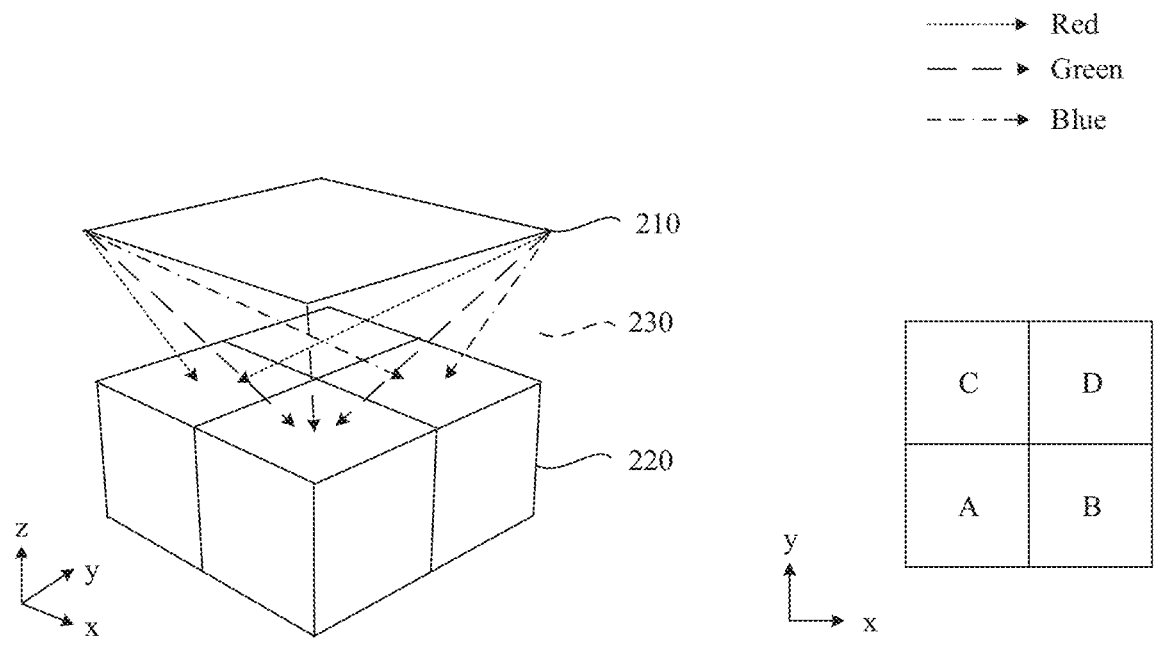

FIG. 8(a) shows a schematic diagram of a structure of one color pixel unit according to an embodiment of this application. As shown in FIG. 8(a), one color pixel unit may include one metasurface structure 210 and four adjacent two-dimensionally arranged optical-to-electrical conversion elements below the metasurface structure 210. The four optical-to-electrical conversion elements respectively correspond to an optical-to-electrical conversion element A, an optical-to-electrical conversion element B, an optical-to-electrical conversion element C, and an optical-to-electrical conversion element D in FIG. 8(b). The four optical-to-electrical conversion elements may be arranged in an RGGB manner. For example, the optical-to-electrical conversion element A, the optical-to-electrical conversion element B, the optical-to-electrical conversion element C, and the optical-to-electrical conversion element D may respectively correspond to three frequency bands: red light, green light, green light, and blue light. The metasurface structure 210 may focus red light, green light, and blue light on light sensing positions of the optical-to-electrical conversion element A, the optical-to-electrical conversion element B, the optical-to-electrical conversion element C, and the optical-electrical conversion element D respectively.

It should be understood that values of the foregoing frequency spectrum bands are merely used as reference data for explanation, and should not be considered as a limitation on this embodiment of this application. A specific frequency range of each frequency spectrum channel is subject to an overall frequency spectrum design of an actual image sensor and an actual frequency spectrum response range of an optical-to-electrical conversion element. A quantity of optical-to-electrical conversion elements in one color pixel unit shown in FIG. 8(a) and FIG. 8(b) is merely an example, and does not constitute a limitation on this embodiment of this application.

Figure 9:
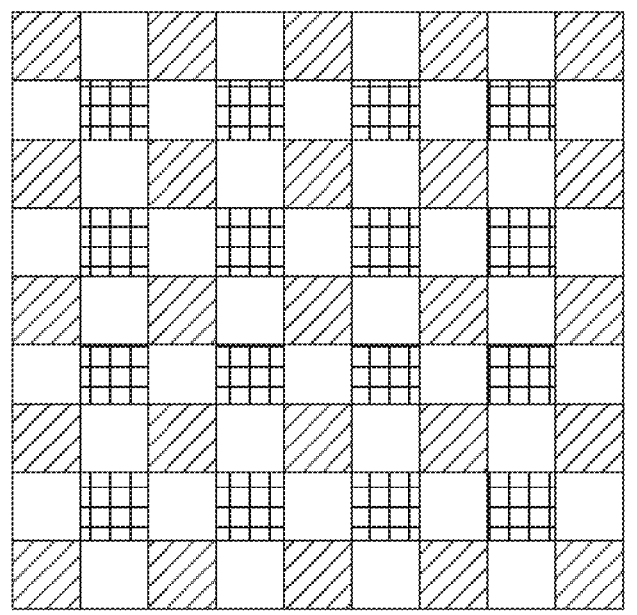
FIG. 9 is a schematic diagram of an arrangement manner of optical-to-electrical conversion elements according to an embodiment of this application.

FIG. 9 shows a schematic diagram of an array of optical-to-electrical conversion units 220. As shown in FIG. 9, each optical-to-electrical conversion unit 220 may correspond to four optical-to-electrical conversion elements, and the four optical-to-electrical conversion elements are arranged in an RGGB manner.

It should be understood that a quantity of optical-to-electrical conversion elements in one optical-to-electrical conversion unit 220 shown in FIG. 8(a) and FIG. 8(b) and FIG. 9 is merely an example, and does not constitute a limitation on this embodiment of this application.

As described above, each optical-to-electrical conversion unit 220 includes n optical-to-electrical conversion elements, and the n optical-to-electrical conversion elements may correspond to n frequency bands. The n frequency bands may include V different frequency bands. In other words, n and V may be different, and each optical-to-electrical conversion unit 220 may correspond to V different frequency bands in a spectrum.

For example, n may be 4, and V may be 3. For example, the three frequency bands may be red light, green light, and blue light. One optical-to-electrical conversion unit 220 may include four optical-to-electrical conversion elements, in other words, one metasurface structure 210 may cover four optical-to-electrical conversion elements. The four optical-to-electrical conversion elements may separately correspond to one of the three frequency bands: red light, green light, and blue light.

Optionally, the plurality of optical-to-electrical conversion elements correspond to the V different frequency bands in the spectrum, and V may be an integer greater than 3.

In other words, a quantity of optical-to-electrical conversion elements included in one optical-to-electrical conversion unit 220 is also greater than 3.

For example, V may be 4, and the four frequency bands may be red, yellow, cyan, and purple. The four frequency bands may also be cyan (C), magenta (M), yellow (Y), and white (W).

V and n may be the same. For example, one optical-to-electrical conversion unit 220 may include four optical-to-electrical conversion elements, in other words, one metasurface structure 210 may cover four optical-to-electrical conversion elements. The four optical-to-electrical conversion elements respectively correspond to the four frequency bands: red, yellow, cyan, and purple.

For example, V may be 7, and the seven frequency bands may be red, orange, yellow, green, cyan, blue, and purple.

V and n may be different. For example, one optical-to-electrical conversion unit 220 may include nine optical-to-electrical conversion elements, in other words, one metasurface structure 210 may cover nine optical-to-electrical conversion elements. The nine photoelectric conversion elements respectively correspond to the seven frequency bands: red, orange, yellow, green, cyan, blue, and purple, in other words, two same frequency bands exist in the nine frequency bands corresponding to the nine optical-to-electrical conversion elements.

A quantity of different frequency bands corresponding to one optical-to-electrical conversion unit 220 is increased, in other words, a quantity of optical-to-electrical conversion elements covered by one metasurface structure 210 is increased. This can greatly reduce a loss of frequency spectrum information collected by the image sensor while a light utilization loss is small, and obtain more frequency spectrum information, thereby improving frequency spectrum utilization of the image sensor, reducing a loss of color information of an image, and increasing color fidelity of imaging.

In one optical-to-electrical conversion unit 220, a quantity of frequency bands corresponding to the optical-to-electrical conversion element may be referred to as a quantity of frequency spectrum channels, and a position of one optical-to-electrical conversion element corresponding to one frequency band may be referred to as a position of a frequency spectrum channel.

The quantity of frequency spectrum channels and the position of the frequency spectrum channel are related to different imaging requirements. Different quantities of frequency spectrum channels and/or different positions of frequency spectrum channels can meet different imaging requirements.

For example, when multispectral imaging needs to be performed, that is, a material of a photographed object is determined by obtaining frequency spectrum information of the photographed object, one optical-to-electrical conversion unit 220 may include nine optical-to-electrical conversion elements, in other words, each metasurface structure 210 may cover nine optical-to-electrical conversion elements, and each optical-to-electrical conversion element may correspond to one frequency band. For example, the nine photoelectric conversion elements respectively correspond to seven frequency bands: red orange, yellow, green, cyan, blue, and purple.

For example, when another color arrangement is required, for example, four frequency bands: cyan (C), magenta (M), yellow (Y), and white (W) are required, one optical-to-electrical conversion unit 220 may include four optical-to-electrical conversion elements, in other words, each metasurface structure 210 may cover four optical-to-electrical conversion elements, and frequency bands corresponding to the four optical-to-electrical conversion elements may be arranged in a CMYW manner. For another example, three frequency bands: red, yellow, and blue are required. One optical-to-electrical conversion unit 220 may include four optical-to-electrical conversion elements, in other words, each metasurface structure 210 may cover four optical-to-electrical conversion elements. Frequency bands corresponding to the four photoelectric conversion elements may be arranged in an RYYB manner.

Figure 10A:
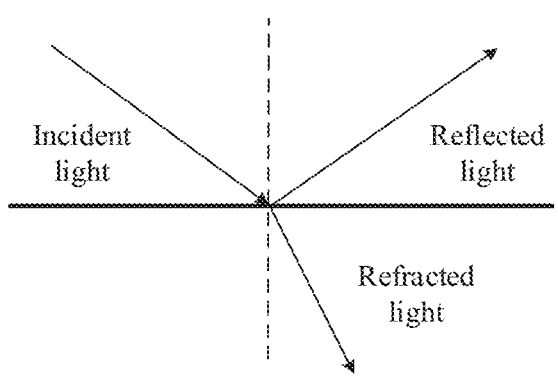
FIG. 10(a) and FIG. 10(h) are a schematic diagram of refraction and reflection of an optical signal according to an embodiment of this application.
Figure 10B:
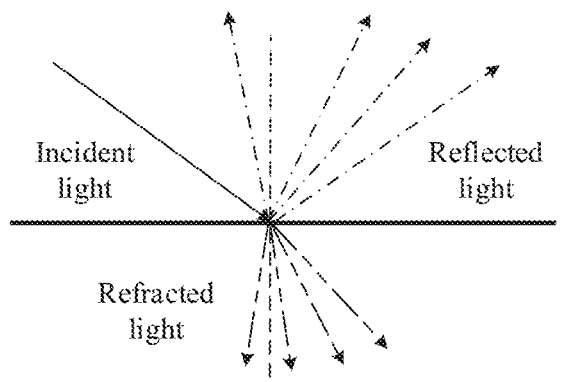

FIG. 10(*a*) and FIG. 10(*h*) show a schematic diagram of transmission paths of reflection and refraction of an optical signal. According to the generalized Snell law, directions of reflected light and transmitted light depend not only on a refractive index of an interface material, but also on phase gradient distribution on an interface. A formula for calculating a refractive index of the generalized Snell law is as follows:

$$n_1\sin(\theta_2) - n_2\sin(\theta_1) = \frac{\lambda_0}{2\pi}\frac{d\phi}{dx}$$

$n_1$ indicates a refractive index of incident space, $n_2$ indicates a refractive index of emergent space, $\theta_2$ indicates an incident angle, $\theta_1$ indicates a refraction angle, $$\frac{d\phi}{dx}$$

indicates a spatial transmission phase gradient along an λ direction, and $\lambda_0$ indicates a wavelength of the optical signal.

FIG. 10(*a*) shows the transmission paths of the refracted light and the reflected light when a spatial transmission phase gradient on the interface is 0. FIG. 10(*b*) shows the transmission paths of the refracted light and the reflected light when the spatial transmission phase gradient on the interface is not 0.

Optionally, the microstructure and the first substrate are configured to generate a spatial transmission phase in a tangent direction of the array of metasurface structures 210, to obtain a spatial transmission phase gradient. The spatial transmission phase gradient is used to transmit an optical signal at each frequency band to the optical-to-electrical conversion element corresponding to each frequency band. In this embodiment of this application, the transmission phase may also be referred to as a transmission phase.

Existence of the spatial transmission phase gradient enables an incident optical signal to form a resonance effect with the metasurface structure 210. When optical signals of different frequency bands pass through the metasurface structure 210, different transmission phase changes are generated in the metasurface structure 210, so that a refraction angle of the optical signal can be changed, in other words, a propagation direction of the optical signal is controlled, and the optical signals of different frequency bands are transmitted to optical-to-electrical conversion elements corresponding to different frequency bands.

Based on positions of the optical-to-electrical conversion elements corresponding to different frequency bands in the optical-to-electrical conversion unit 220, a refraction angle corresponding to an optical signal at each frequency band in each position of the metasurface structure 210, in other words, a transmission direction corresponding to the optical signal at each frequency band in each position, may be obtained by calculation, so that spatial transmission phase distribution of the metasurface structure 210 may be obtained.

The spatial transmission phase distribution is related to a wavelength of the optical signal at each frequency band, a position at which the optical signal at each frequency band is incident to the metasurface structure, and a position at which the optical signal at each frequency band is transmitted to the optical-to-electrical conversion element corresponding to each frequency band.

Optionally, when the metasurface structure 210 is not in direct contact with the optical-to-electrical conversion unit 220, in other words, there is a medium between the metasurface structure 210 and the optical-to-electrical conversion unit 220, the spatial transmission phase distribution is further related to a refractive index of the medium between the metasurface structure 210 and the optical-to-electrical conversion unit 220. In some cases, in other words, the spatial transmission phase distribution is related to the refractive index of the medium between the metasurface structure 210 and the optical-to-electrical conversion unit 220. For example, when mediums between a plurality of optical-to-electrical conversion elements in one optical-to-electrical conversion unit 220 and the metasurface structure 210 are the same, the spatial transmission phase distribution is related to the refractive index of the medium between the metasurface structure 210 and the optical-to-electrical conversion unit 220. It may be understood that the spatial transmission phase distribution is related to the refractive index of the medium between the metasurface structure 210 and the optical-to-electrical conversion unit 220.

For example, a spatial transmission phase of an $n^{th}$ frequency band at a position on the metasurface structure 210 is related to a wavelength of an optical signal at the $n^{th}$ frequency band, coordinates of a position at which the optical signal at the $n^{th}$ frequency band is transmitted to an optical-to-electrical conversion element corresponding to the $n^{th}$ frequency band, and a refractive index of a medium between the metasurface structure 210 and the optical-to-electrical conversion unit 220.

A phase difference is caused because an optical signal passes through different distances in a transmission process. For any frequency band, the metasurface structure may enable an optical signal that is incident from an object point to any location on the metasurface structure to have a same phase when arriving at the optical-to-electrical conversion element, in other words, the metasurface structure may be used to compensate for a phase difference caused by different optical paths. For example, a spatial transmission phase at a position A on the metasurface structure is $\phi$, a phase generated by transmission from the position A to a position B on the optical-to-electrical conversion element is $\phi_1$, a distance from a position C on the metasurface structure to the position B on the optical-to-electrical conversion element is the shortest, a phase generated by transmission from the position C to the position B on the optical-to-electrical conversion element is $\phi_0$, and the spatial transmission phase $\phi$ at the position A meets:

$$\phi = \phi_0 - \phi_1$$

Specifically, for the $n^{th}$ frequency band, $\phi_0$ satisfies:

$$\phi_0 = \frac{2\pi n_{sub}}{\lambda_n} f_n + C$$

For the $n^{th}$ frequency band, $\phi_1$ satisfies:

$$\phi_1 = \frac{2\pi n_{sub}}{\lambda_n} \sqrt{(x - x_{f,n})^2 + (y - y_{f,n})^2 + f_n^2}$$

$\lambda_n$ indicates the wavelength of the optical signal at the $n^{th}$ frequency band, $f_n$ indicates a focal length corresponding to the optical signal at the $n^{th}$ frequency band, the focal length is used to ensure that the optical signal at the $n^{th}$ frequency band is transmitted to a light sensing position of the optical-to-electrical conversion element corresponding to the $n^{th}$ frequency band, $n_{sub}$ indicates the refractive index of the medium between the metasurface structure 210 and the optical-to-electrical conversion unit 220, and C is any phase. The focal length corresponding to the optical signal at the $n^{th}$ frequency band may be a vertical distance between the metasurface structure and a focus corresponding to the optical signal at the $n^{th}$ frequency band.

For example, the focus may be located on the optical-to-electrical conversion element corresponding to the $n^{th}$ frequency band, or may be located above the optical-to-electrical conversion element corresponding to the $n^{th}$ frequency band, or may be located below the optical-to-electrical conversion element corresponding to the $n^{th}$ frequency band, as long as the optical signal at the $n^{th}$ frequency band can be transmitted to a light sensing area on the optical-to-electrical conversion element corresponding to the $n^{th}$ frequency band.

Optionally, the spatial transmission phase distribution $\phi(x,y,\lambda_n)$ of the metasurface structure 210 meets:

$$\phi(x, y, \lambda_n) = \frac{2\pi n}{\lambda_n}\left[f_n - \sqrt{(x - x_{f,n})^2 + (y - y_{f,n})^2 + f_n^2}\right] + C$$

$\phi(x,y,\lambda_n)$ indicates phase distribution corresponding to each position and frequency band on the metasurface structure 210, x,y indicates coordinates on the metasurface structure 210, $\lambda_n$ indicates the wavelength of the optical signal at the $n^{th}$ frequency band, $f_n$ indicates the focal length corresponding to the optical signal at the $n^{th}$ frequency band, where the focal length is used to ensure that the optical signal at the $n^{th}$ frequency band is transmitted to the light sensing position of the optical-to-electrical conversion element corresponding to the $n^{th}$ frequency band, $x_{f,n}$ and $y_{f,n}$ indicate coordinates of a position at which the optical signal at the $n^{th}$ frequency band is transmitted to the optical-to-electrical conversion element corresponding to the $n^{th}$ frequency band, indicates the refractive index of the medium between the metasurface structure 210 and the optical-to-electrical conversion unit 220, and C is any phase.

When the image sensor 200 includes the second substrate 230, the medium may be the second substrate 230.

Figure 11C:
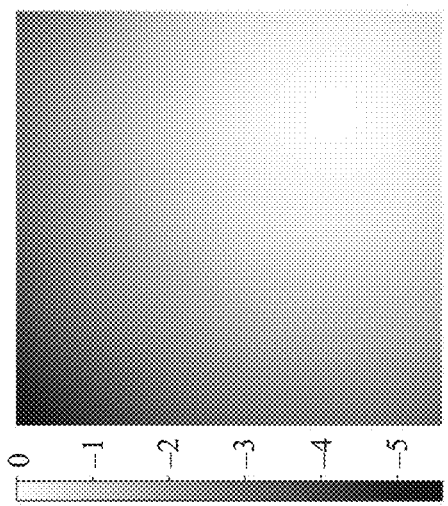
FIG. 11(a) to FIG. 11(c) are a schematic diagram of spatial transmission phase distribution corresponding to different frequency bands according to an embodiment of this application.
Figure 11B:
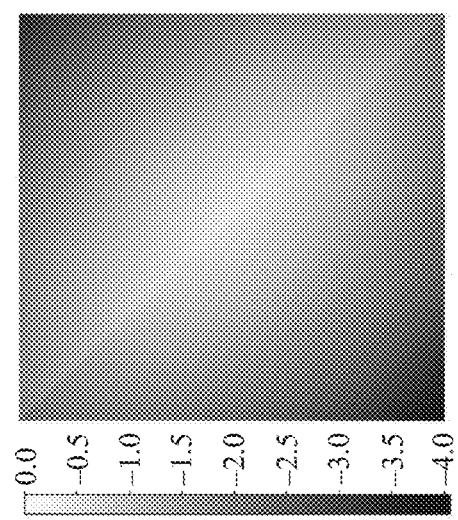
Figure 11A:
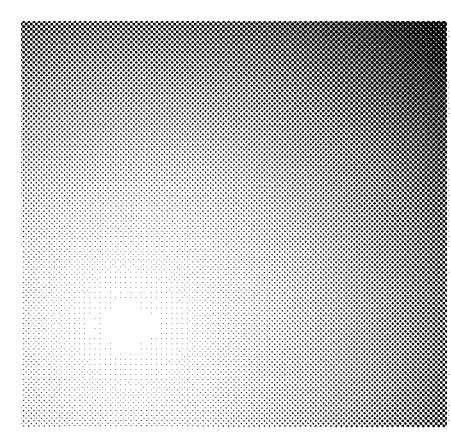

For example, for the color pixel unit shown in FIG. 8(*a*), FIG. 11(*a*) to FIG. 11(*c*) show a schematic diagram of spatial transmission phase distribution of the metasurface structure 210 at different frequency bands. A size of one optical-to-electrical conversion element may be 1.6 um*1.6 um, that is, a size of one optical-to-electrical conversion unit 220 may be 3.2 um*3.2 um, a size of one metasurface structure 210 may be 3.2 um*3.2 um, and a thickness of the second substrate may be 15 um. Light with a center wavelength of 650 nm of a red spectrum is focused on a center of the photoelectric conversion element A, light with a center wavelength of 550 nm of a green spectrum is focused on centers of the photoelectric conversion element B and the photoelectric conversion element C, and with a center wavelength of 450 nm of a blue spectrum is focused on a center of the photoelectric conversion element D. A material of the second substrate may be silicon dioxide glass with a refractive index $n_{sub}$=1.47~1.46, and obtained spatial transmission phase distribution is shown in FIG. 11(*a*) to FIG. 11(*c*). FIG. 11(*a*) shows spatial transmission phase distribution corresponding to a wavelength of 650 nm, FIG. 11(*b*) shows spatial transmission phase distribution corresponding to a wavelength of 550 nm, and FIG. 11(*c*) shows spatial transmission phase distribution corresponding to a wavelength of 450 nm.

The foregoing uses only a center wavelength of each frequency band as an example. For another frequency or another wavelength, corresponding spatial transmission phase distribution may also be calculated by using the foregoing formula.

For example, a center frequency of each frequency band may be enabled to achieve maximum focusing efficiency, and focusing efficiency of another frequency in the frequency band may be lower than a focusing efficiency of the center frequency. In other words, the center frequency is focused to a central position of an optical-to-electrical conversion element corresponding to the frequency band, and the another frequency in the frequency band needs to be aggregated, based on the belonged frequency band, to a corresponding light sending position on the optical-to-electrical conversion element corresponding to the frequency band.

A transmission phase change generated on the metasurface structure 210 is related to factors such as a size of the microstructure, a shape of the microstructure, a material of the microstructure, and a material of the first substrate.

Optionally, the material of the microstructure may be a low-loss dielectric material, for example, titanium dioxide, gallium nitride, or silicon carbide.

Optionally, a material of the first substrate may be a low-loss dielectric material, for example, silicon dioxide, titanium dioxide, gallium nitride, or silicon carbide.

According to the solution provided in this embodiment of this application, the metasurface structure can be used to adjust a transmission direction of the optical signal, and transmit an optical signal at each frequency band in optical signals received by the entire metasurface structure to an optical-to-electrical conversion element corresponding to the frequency band. An existing light filtering manner is replaced with a light splitting manner, to avoid an optical signal loss in an optical filtering process. A rotationally symmetric structure with a rotation angle less than or equal to 90 degrees is used, and has a same response to optical signals with different polarizations, therefore there is no polarization dependence. This improves light transmittance of each spectral channel, overall light utilization of the image sensor, and imaging quality of an output image. For example, the polarization may include linear polarization and circular polarization. Compared with a Bayer color filter system, in the solution of this embodiment of this application, light filtering is not performed, and a micro lens array and a Bayer color filter are replaced with the array of metasurface structures, in other words, a color separation and focusing solution is used to replace a light filtering and focusing solution. This avoids an optical signal loss in a light filtering process, improves light utilization of the image sensor in principle, and improves imaging quality of an output image. In addition, in the solution in this embodiment of this application, a quantity of different frequency bands corresponding to one optical-to-electrical conversion unit is increased, so that more frequency spectrum information can be obtained with a small light utilization loss. This improves frequency spectrum utilization of the image sensor, reduces a color information loss of an image, improves color fidelity of imaging, and improves imaging quality.

Figure 12:
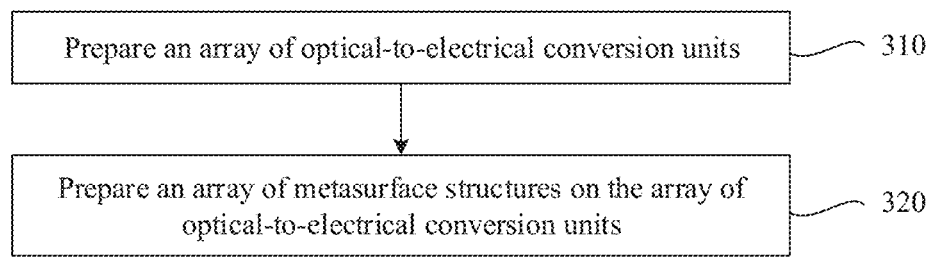
FIG. 12 is a schematic diagram of an image sensor preparation method according to an embodiment of this application.

FIG. 12 shows a schematic diagram of an image sensor preparation method 300 according to an embodiment of this application. The method 300 may be used to prepare the image sensor 200 in the foregoing embodiment of this application. To avoid unnecessary repetition, the following appropriately omits repeated descriptions when describing the image sensor preparation method in this embodiment of this application. The method 300 includes steps 310 and 320. The following describes step 310 and step 320 in detail.

310: Prepare an array of optical-to-electrical conversion units.

320: Prepare an array of metasurface structures on the array of optical-to-electrical conversion units. The optical-to-electrical conversion unit includes a plurality of optical-to-electrical conversion elements, each optical-to-electrical conversion element in the optical-to-electrical conversion unit corresponds to one frequency band in a spectrum, the metasurface structure includes a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees.

For example, the array of optical-to-electrical conversion units and the array of metasurface structures are processed in an integrated manner by using a CMOS process.

For example, step 320 may be depositing the first substrate on the array of optical-to-electrical conversion units, and preparing the microstructure on the first substrate.

Optionally, the microstructure and the first substrate are configured to generate a spatial transmission phase in a tangent direction of the array of metasurface structures, to obtain a spatial transmission phase gradient. The spatial transmission phase gradient is used to transmit the optical signal at each frequency band to the optical-to-electrical conversion element corresponding to each frequency band.

Optionally, the image sensor may further include a second substrate.

For example, step 320 may be depositing the second substrate on the array of optical-to-electrical conversion units, and preparing the array of metasurface structures on the second substrate.

According to the solution this embodiment of this application, the array of optical-to-electrical conversion units and the array of metasurface structures are processed in an integrated manner, so that a good alignment effect between the optical-to-electrical conversion unit and the metasurface structure can be ensured. This improves precision of an image sensor. The metasurface structure can be used to transmit an optical signal at each frequency band in optical signals received by the entire metasurface structure to an optical-to-electrical conversion element corresponding to the frequency band. An existing light filtering manner is replaced with a light splitting manner, and a rotationally symmetric structure with a rotation angle less than or equal to 90 degrees is used, and has a same response to optical signals with different polarizations, therefore there is no polarization dependence. This improves light transmittance of each spectral channel, and improves overall light utilization of the image sensor.

Figure 13:
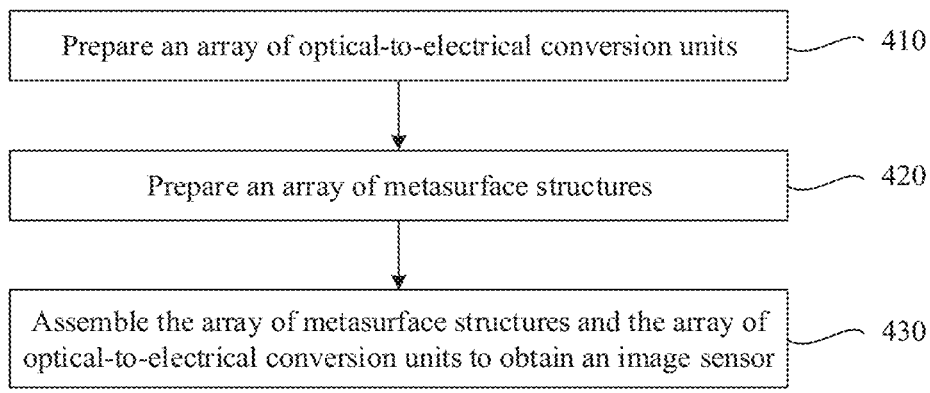
FIG. 13 is a schematic diagram of another image sensor preparation method according to an embodiment of this application.

FIG. 13 shows a schematic diagram of an image sensor preparation method 400 according to an embodiment of this application. The method 400 may be used to prepare the image sensor 200 in the foregoing embodiment of this application. To avoid unnecessary repetition, the following appropriately omits repeated descriptions when describing the image sensor preparation method in this embodiment of this application. The method 400 includes steps 410 to 430. The following describes step 410 to step 430 in detail.

410: Prepare an array of optical-to-electrical conversion units.

420: Prepare an array of metasurface structure.

430: Assemble the array of metasurface structures and the array of optical-to-electrical conversion units to obtain the image sensor. The optical-to-electrical conversion unit includes a plurality of optical-to-electrical conversion elements, each optical-to-electrical conversion element in the optical-to-electrical conversion unit corresponds to one frequency band in a spectrum, the metasurface structure includes a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees.

For example, the array of metasurface structures is prepared by using a CMOS process, and then is assembled with the array of optical-to-electrical conversion units.

For example, step 420 may be depositing the first substrate in the array of metasurface structures, and preparing, on the first substrate, the microstructure in the array of metasurface structures.

Optionally, the microstructure and the first substrate are configured to generate a spatial transmission phase in a tangent direction of the array of metasurface structures, to obtain a spatial transmission phase gradient. The spatial transmission phase gradient is used to transmit the optical signal at each frequency band to the optical-to-electrical conversion element corresponding to each frequency band.

Optionally, the image sensor may further include a second substrate.

For example, step 430 may be depositing a second substrate on the array of optical-to-electrical conversion units, and assembling the array of optical-to-electrical conversion units including the second substrate and the array of metasurface structures to obtain the image sensor.

According to the solution in this embodiment of this application, the array of optical-to-electrical conversion units and the array of metasurface structures are separately processed, and a processing technology is simple. The metasurface structure can be used to transmit an optical signal at each frequency band in optical signals received by the entire metasurface structure to an optical-to-electrical conversion element corresponding to the frequency band. An existing light filtering manner is replaced with a light splitting manner, and a rotationally symmetric structure with a rotation angle less than or equal to 90 degrees is used, and has a same response to optical signals with different polarizations, therefore there is no polarization dependence. This improves light transmittance of each spectral channel, and improves overall light utilization of the image sensor.

Figure 14:
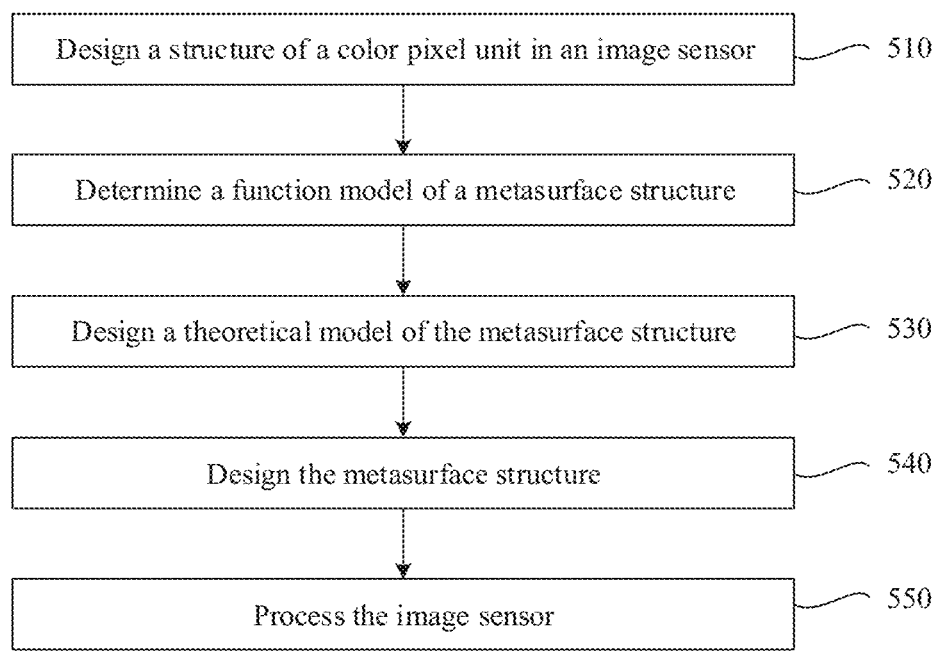
FIG. 14 is a schematic diagram of an image sensor design method according to an embodiment of this application.

FIG. 14 shows a schematic diagram of an image sensor design method 500 according to an embodiment of this application. The method 500 may be used to design the image sensor 200 in the foregoing embodiment of this application. To avoid unnecessary repetition, the following appropriately omits repeated descriptions when describing the image sensor design method in this embodiment of this application. The method 500 includes steps 510 to 550. The following describes step 510 to step 550 in detail.

510: Design a structure of a color pixel unit in the image sensor.

The structure may be shown in FIG. 8(a). The image sensor may include a plurality of color pixel units. One color pixel unit may include an optical-to-electrical conversion unit and a metasurface structure. A bottom layer of one color pixel unit may be the optical-to-electrical conversion unit. The optical-to-electrical conversion unit may be an array of optical-to-electrical conversion elements. Each optical-to-electrical conversion element in the optical-to-electrical conversion unit may correspond to one frequency band in a spectrum. The metasurface structure may be on the array of optical-to-electrical elements. In other words, the metasurface structure may cover a plurality of optical-to-electrical conversion elements.

The color pixel unit may further include a second substrate located between the optical-to-electrical conversion unit and the metasurface structure. The second substrate may be configured to support the metasurface structure.

520: Determine a function model of the metasurface structure. In other words, a position of a frequency spectrum channel and a quantity of frequency spectrum channels in the image sensor are determined.

In one color pixel unit, a metasurface structure is configured to separately focus optical signals of different frequency bands to light sensing positions of different optical-to-electrical conversion elements. To determine the function model of the metasurface structure is to determine a frequency band corresponding to the optical-to-electrical conversion element, an arrangement manner of the frequency band corresponding to the optical-to-electrical conversion element, a quantity of optical-to-electrical conversion elements in the optical-to-electrical conversion unit, and the like.

For example, the function model of the metasurface structure may be determined based on an imaging requirement, in other words, the frequency band corresponding to the optical-to-electrical conversion element, the arrangement manner of the frequency band corresponding to the optical-to-electrical conversion element, the quantity of optical-to-electrical conversion elements in the optical-to-electrical conversion unit, and the like may be determined based on the imaging requirement. For example, the frequency band corresponding to the optical-to-electrical conversion element may include red light, green light, and blue light. One optical-to-electrical conversion unit may include four optical-to-electrical conversion elements, and the four optical-to-electrical conversion elements respectively correspond to one frequency band of red light, green light, and blue light. Frequency bands corresponding to the four optical-to-electrical conversion elements may be arranged in an RGGB manner, as shown in FIG. 8(b). The metasurface structure may respectively focus red light, green light, and blue light on light sensing positions of the four optical-to-electrical conversion elements in FIG. 8(a) and FIG. 8(b).

The foregoing is merely an example. If more frequency spectrum information is required, a quantity of optical-to-electrical conversion elements covered by the metasurface structure and a quantity of different frequency bands corresponding to the optical-to-electrical conversion element may be increased, so that the metasurface structure is adaptively changed, to obtain more frequency spectrum information. If information of another frequency band is required, the information of the another frequency band may be obtained by changing different frequency bands corresponding to the photoelectric conversion element, adaptively changing the metasurface structure, or the like. In other words, a design of the metasurface structure is changed by changing the quantity of optical-to-electrical conversion elements covered by the metasurface structure, the frequency band corresponding to the optical-to-electrical conversion element, an arrangement manner of the frequency band corresponding to the optical-to-electrical conversion element, and the like, and more frequency spectrum information is obtained by modifying a light-splitting focusing position of the metasurface structure based on a position of a frequency spectrum channel and a corresponding frequency, which can meet different imaging requirements.

530: Design a theoretical model of the metasurface structure. The theoretical model of the metasurface structure may also be understood as a spatial transmission phase of the metasurface structure.

Positions of optical-to-electrical conversion elements corresponding to different frequency bands in the optical-to-electrical conversion unit may be determined based on the functional model of the metasurface structure in step 520, a refraction angle that needs to be implemented for an optical signal at each frequency band on the metasurface structure is calculated, and a refraction angle corresponding to the optical signal at each frequency band at each position of the metasurface structure, or a transmission direction corresponding to the optical signal at each frequency band at each position is obtained by calculation, so that spatial transmission phase distribution of the metasurface structure may be obtained.

Optionally, the spatial transmission phase distribution of the metasurface structure 210 meets:

$$\phi(x, y, \lambda_n) = \frac{2\pi n_{sub}}{\lambda_n}\left[f_n - \sqrt{(x - x_{f,n})^2 + (y - y_{f,n})^2 + f_n^2}\right] + C$$

$\phi(x,y,\lambda_n)$ indicates phase distribution corresponding to each position and frequency, band on the metasurface structure, x,y indicates coordinates on the metasurface structure, $\lambda_n$ indicates a wavelength of an optical signal at an $n^{th}$ frequency band, $f_n$ indicates a focal length corresponding to the optical signal at the $n^{th}$ frequency band, where the focal length is used to ensure that the optical signal at the $n^{th}$ frequency band is focused on a light sensing position of an optical-to-electrical conversion element corresponding to the $n^{th}$ frequency band, $x_{f,n}$ and $y_{f,n}$ indicate coordinates of a position at which the optical signal at the $n^{th}$ frequency band is transmitted to the optical-to-electrical conversion element corresponding to the $n^{th}$ frequency band, $n_{sub}$ indicates a refractive index of a medium between the metasurface structure and the optical-to-electrical conversion unit, and C is any constant.

When the image sensor includes a second substrate, the medium may be the second substrate.

540: Design a metasurface structure, in other words, design a metasurface structure unit.

The metasurface structure may be designed based on the spatial transmission phase distribution that is required on the metasurface structure and that is obtained in step 530.

The metasurface structure may include a first substrate and a microstructure. To design the metasurface structure is to design the first substrate and the microstructure.

Specifically, a geometric structure of the microstructure may be designed based on the spatial transmission phase distribution. The microstructure is a rotationally symmetric structure, and a rotation angle of the rotationally symmetric structure is less than or equal to 90 degrees. For example, the microstructure may be a cylindrical, square-column, or cross-shaped structure. A material of the microstructure may also be designed. The material of the microstructure may be a low-loss dielectric material such as titanium dioxide, gallium nitride, or silicon carbide. A material of the first substrate may also be designed. The material of the substrate may be a low-loss dielectric material such as titanium dioxide, gallium nitride, or silicon carbide.

According to the foregoing method, a plurality of groups of first substrates and microstructures that meet spatial transmission phase distribution required by the metasurface structure may be obtained. Transmission phases and transmittances of the metasurface structures at different frequencies may be obtained based on full-wave simulation. When the spatial transmission phase distribution required in the theoretical model in step 530 is met, a microstructure with a highest transmittance is selected as a final microstructure, to obtain spatial distribution of the microstructure.

550: Process the image sensor.

For example, an array of optical-to-electrical conversion units may be prepared first, and then an array of metasurface structures is prepared on the array of optical-to-electrical conversion units.

For example, the array of optical-to-electrical conversion units and the array of metasurface structures may be processed in an integrated manner by using a CMOS process.

For example, the array of optical-to-electrical conversion units and the array of metasurface structures may be prepared, and then the array of metasurface structures and the array of optical-to-electrical conversion units are assembled to obtain the image sensor. In this way, an existing image sensor processing technology can be matched.

For example, the array of metasurface structures is prepared by using the CMOS process, and then is assembled with the array of optical-to-electrical conversion units.

In this application, directional terms such as "center", "upper", "lower", "left", "right", "top", and "bottom" are defined relative to directions or positions of components schematically placed in the accompanying drawings. It should be understood that these directional terms are relative concepts and are used for relative description and clarification, and are not used to indicate or imply that an indicated apparatus or component needs to have a specified direction or be constructed and operated in a specified direction. The terms may change accordingly with directions in which components in the accompanying drawings are placed, and therefore cannot be construed as a limitation of this application.

It should be further noted that in the embodiments of this application, a same reference numeral indicates a same component or a same part. For same parts in the embodiments of this application, only one part or component marked with a reference numeral may be used as an example in the figure. It should be understood that the reference numeral is also applicable to another same part or component.

It should be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that sequence numbers of the foregoing processes do not mean execution sequences in various embodiments of this application. The execution sequences of the processes should be determined according to functions and internal logic of the processes, and should not be construed as any limitation on the implementation processes of embodiments of this application.

A person of ordinary skill in the art may be aware that, in combination with the units and algorithm steps in the examples described in embodiments disclosed in this specification, this application can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiment. Details are not described herein again.

In the several embodiments provided in this application, it should be understood that the disclosed system, apparatus, and method may be implemented in other manners. For example, the described apparatus embodiments are merely examples. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate components may or may not be physically separate, and components displayed as units may or may not be physical units, in other words, may be located at one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the method described in embodiments of this application. The foregoing storage medium includes any medium that can store program code, such as a universal serial bus flash disk (USB flash disk, UFD), a removable hard disk, a read-only memory (ROM), a random access memory (RAM), a magnetic disk, or a compact disc. The UFD may also be briefly referred to as a USB flash drive or a USB flash drive.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An image sensor, comprising:
an array of metasurface structures and an array of optical-to-electrical conversion units, wherein the array of metasurface structures is located above the array of optical-to-electrical conversion units; and
a first optical-to-electrical conversion unit in the array of optical-to-electrical conversion units comprises a plurality of optical-to-electrical conversion elements, each optical-to-electrical conversion element in the first optical-to-electrical conversion unit corresponds to one frequency band in a spectrum, a first metasurface structure in the array of metasurface structures comprises a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, a rotation angle of the rotationally symmetric structure is less than or equal to 90 degrees, and wherein:
the microstructure and the first substrate are configured to generate a spatial transmission phase in a tangential direction of the array of metasurface structures, to obtain a spatial transmission phase gradient, and the spatial transmission phase $\phi(x, y, \lambda_n)$ meets:

$$\phi(x, y, \lambda_n) = \frac{2\pi n_{sub}}{\lambda_n} \left[ f_n - \sqrt{(x - x_{f,n})^2 + (y - y_{f,n})^2 + f_n^2} \right] + C,$$

x, y represents coordinates of a position on the first metasurface structure, $\lambda_n$ represents a wavelength of an optical signal at an $n^{th}$ frequency band, $f_n$ represents a focal length corresponding to the optical signal at the $n^{th}$ frequency band, $x_{f,n}$ and $y_{f,n}$ represent coordinates of a position at which the optical signal at the $n^{th}$ frequency band is transmitted to an optical-to-electrical conversion element corresponding to the $n^{th}$ frequency band, $n_{sub}$ represents a refractive index of a medium between the first metasurface structure and the first optical-to-electrical conversion unit, and C is a phase.

2. The image sensor according to claim 1, wherein the spatial transmission phase gradient is used to transmit the optical signal at each frequency band to the optical-to-electrical conversion element corresponding to each frequency band.

3. The image sensor according to claim 2, wherein the spatial transmission phase is related to a wavelength of the optical signal at each frequency band, a position at which the optical signal at each frequency band is incident to the first metasurface structure, a position at which the optical signal at each frequency band is transmitted to the optical-to-electrical conversion element corresponding to each frequency band, and a refractive index of a medium between the first metasurface structure and the optical-to-electrical conversion element.

4. The image sensor according to claim 3, wherein the medium comprises a second substrate.

5. The image sensor according to claim 1, wherein the microstructure comprises a cylindrical structure, a square column structure, or a cross-shaped structure.

6. The image sensor according to claim 1, wherein a material of the microstructure comprises titanium dioxide, gallium nitride, or silicon carbide.

7. The image sensor according to claim 1, wherein the plurality of optical-to-electrical conversion elements correspond to V different frequency bands in the spectrum, and V is an integer greater than 3.

8. An image sensor preparation method, wherein the method comprises:
preparing an array of optical-to-electrical conversion units; and
preparing an array of metasurface structures on the array of optical-to-electrical conversion units, wherein a first optical-to-electrical conversion unit in the array of optical-to-electrical conversion units comprises a plurality of optical-to-electrical conversion elements, each optical-to-electrical conversion element in the first optical-to-electrical conversion unit corresponds to one frequency band in a spectrum, a first metasurface structure in the array of metasurface structure comprises a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees, and wherein:
the microstructure and the first substrate are configured to generate a spatial transmission phase in a tangential direction of the array of metasurface structures, to obtain a spatial transmission phase gradient, and the spatial transmission phase $\phi(x, y, \lambda_n)$ meets:

$$\phi(x,y,\lambda_n)=2\pi n_{sub}/\lambda_n[f_n-\sqrt{(x-x_{f,n})^2+(y-y_{f,n})^2+f_n^2}]+C,$$
wherein:

x, y represents coordinates of a position on the first metasurface structure, $\lambda_n$ represents a wavelength of an optical signal at an $n^{th}$ frequency band, $f_n$ represents a focal length corresponding to the optical signal at the $n^{th}$ frequency band, $x_{f,n}$ and $y_{f,n}$ represent coordinates of a position at which the optical signal at the $n^{th}$ frequency band is transmitted to an optical-to-electrical conversion element corresponding to the $n^{th}$ frequency band, $n_{sub}$ represents a refractive index of a medium between the first metasurface structure and the first optical-to-electrical conversion unit, and C is a phase.

9. The method according to claim 8, wherein the spatial transmission phase gradient is used to transmit the optical signal at each frequency band to the optical-to-electrical conversion element corresponding to each frequency band.

10. The method according to claim 9, wherein the spatial transmission phase is related to a wavelength of the optical signal at each frequency band, a position at which the optical signal at each frequency band is incident to the first metasurface structure, a position at which the optical signal at each frequency band is transmitted to the optical-to-electrical conversion element corresponding to each frequency band, and a refractive index of a medium between the first metasurface structure and the optical-to-electrical conversion element.

11. The method according to claim 10, wherein the medium comprises a second substrate.

12. The method according to claim 8, wherein the microstructure comprises a cylindrical structure, a square column structure, or a cross-shaped structure.

13. An image sensor preparation method, wherein the method comprises:
preparing an array of optical-to-electrical conversion units;
preparing an array of metasurface structures; and
assembling the array of metasurface structures and the array of optical-to-electrical conversion units to obtain an image sensor, wherein:
a first optical-to-electrical conversion unit in the array of optical-to-electrical conversion unit comprises a plurality of optical-to-electrical conversion elements, each optical-to-electrical conversion element in the first optical-to-electrical conversion unit corresponds to one frequency band in a spectrum, a first metasurface structure in the array of metasurface structure comprises a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees, and wherein:
the microstructure and the first substrate are configured to generate a spatial transmission phase in a tangential direction of the array of metasurface structures, to obtain a spatial transmission phase gradient, and the spatial transmission phase $\phi(x, y, \lambda_n)$ meets:

$$\phi(x,y,\lambda_n)=2\pi n_{sub}/\lambda_n[f_n-\sqrt{(x-x_{f,n})^2+(y-y_{f,n})^2+f_n^2}]+C,$$
wherein:

x, y represents coordinates of a position on the first metasurface structure, $\lambda_n$ represents a wavelength of an optical signal at an $n^{th}$ frequency band, $f_n$ represents a focal length corresponding to the optical signal at the $n^{th}$ frequency band, $x_{f,n}$ and $y_{f,n}$ represent coordinates of a position at which the optical signal at the $n^{th}$ frequency band is transmitted to an optical-to-electrical conversion element corresponding to the $n^{th}$ frequency band, non represents a refractive index of a medium between the first metasurface structure and the first optical-to-electrical conversion unit, and C is a phase.

14. The method according to claim 13, wherein the spatial transmission phase gradient is used to transmit the optical signal at each frequency band to the optical-to-electrical conversion element corresponding to each frequency band.

15. The method according to claim 14, wherein the spatial transmission phase is related to a wavelength of the optical signal at each frequency band, a position at which the optical signal at each frequency band is incident to the first metasurface structure, a position at which the optical signal at each frequency band is transmitted to the optical-to-electrical conversion element corresponding to each frequency band, and a refractive index of a medium between the first metasurface structure and the optical-to-electrical conversion element.

16. The method according to claim 15, wherein the medium comprises a second substrate.

17. The method according to claim 13, wherein the microstructure comprises a cylindrical structure, a square column structure, or a cross-shaped structure.

18. An electronic device, comprising an image sensor, wherein the image sensor comprising:
an array of optical-to-electrical conversion units, wherein an array of metasurface structures is located above the array of optical-to-electrical conversion units; and
a first optical-to-electrical conversion unit in the array of optical-to-electrical conversion units comprises a plurality of optical-to-electrical conversion elements, each optical-to-electrical conversion element in the first optical-to-electrical conversion unit corresponds to one frequency band in a spectrum, a first metasurface structure in the array of metasurface structures comprises a first substrate and a microstructure located above the first substrate, the microstructure and the first substrate are configured to transmit an optical signal at each frequency band to an optical-to-electrical conversion element corresponding to each frequency band, the microstructure is a rotationally symmetric structure, and a rotation angle of the rotationally symmetric structure is less than or equal to 90 degrees, and wherein:
the microstructure and the first substrate are configured to generate a spatial transmission phase in a tangential direction of the array of metasurface structures, to obtain a spatial transmission phase gradient, and the spatial transmission phase $\phi(x, y, \lambda_n)$ meets:

$$\phi(x,y,\lambda_n)=2\pi n_{sub}/\lambda_n[f_n-\sqrt{(x-x_{f,n})^2+(y-y_{f,n})^2+f_n^2}]+C,$$

wherein:

x, y represents coordinates of a position on the first metasurface structure, $\lambda_n$ represents a wavelength of an optical signal at an $n^{th}$ frequency band, $f_n$ represents a focal length corresponding to the optical signal at the $n^{th}$ frequency band, $x_{f,n}$ and $y_{f,n}$ represent coordinates of a position at which the optical signal at the $n^{th}$ frequency band is transmitted to an optical-to-electrical conversion element corresponding to the $n^{th}$ frequency band, $n_{sub}$ represents a refractive index of a medium between the first metasurface structure and the first optical-to-electrical conversion unit, and C is a phase.

19. The electronic device according to claim 18, wherein the spatial transmission phase gradient is used to transmit the optical signal at each frequency band to the optical-to-electrical conversion element corresponding to each frequency band.

20. The electronic device according to claim 19, wherein the spatial transmission phase is related to a wavelength of the optical signal at each frequency band, a position at which the optical signal at each frequency band is incident to the first metasurface structure, a position at which the optical signal at each frequency band is transmitted to the optical-to-electrical conversion element corresponding to each frequency band, and a refractive index of a medium between the first metasurface structure and the optical-to-electrical conversion element.

* * * * *

UNITED STATES PATENT AND TRADEMARK OFFICE
CERTIFICATE OF CORRECTION

PATENT NO. : 12,253,414 B2
APPLICATION NO. : 17/855313
DATED : March 18, 2025
INVENTOR(S) : Youming Zhang and Lifeng Sun Page 1 of 1

It is certified that error appears in the above-identified patent and that said Letters Patent is hereby corrected as shown below:

In the Claims

In Column 24, In Line 57 (Approx.), In Claim 1, after "C," insert -- wherein: --.

In Column 25, In Line 64, In Claim 8, delete "An" and insert -- $\lambda_n$ --.

In Column 27, In Line 3, In Claim 13, delete "non" and insert -- $n_{sub}$ --.

Signed and Sealed this
Twenty-second Day of July, 2025

Coke Morgan Stewart
*Acting Director of the United States Patent and Trademark Office*